US012575286B2

(12) United States Patent
Zhang et al.

(10) Patent No.: US 12,575,286 B2
(45) Date of Patent: Mar. 10, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Ming Zhang, Wuhan (CN); Jinchang Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 677 days.

(21) Appl. No.: 18/051,267

(22) Filed: Oct. 31, 2022

(65) Prior Publication Data

US 2024/0057424 A1    Feb. 15, 2024

(30) Foreign Application Priority Data

Aug. 15, 2022    (CN) .......................... 202210971391.6

(51) Int. Cl.
*H10K 59/35*            (2023.01)
(52) U.S. Cl.
CPC ......... *H10K 59/353* (2023.02); *H10K 59/352* (2023.02)
(58) Field of Classification Search
CPC ...... H10K 59/353; H10K 59/352; G09G 3/32; G09G 2300/0426
See application file for complete search history.

(56) References Cited

U.S. PATENT DOCUMENTS

| | | | |
|---|---|---|---|
| 2016/0063911 A1 | 3/2016 | Wu et al. | |
| 2019/0252469 A1* | 8/2019 | Xiao ..................... | G09G 3/3225 |
| 2021/0375182 A1 | 12/2021 | Huang et al. | |
| 2022/0102438 A1 | 3/2022 | Xiao et al. | |
| 2022/0238610 A1 | 7/2022 | Xu et al. | |

FOREIGN PATENT DOCUMENTS

| | | |
|---|---|---|
| CN | 107910348 A | 4/2018 |
| CN | 110620135 A | 12/2019 |
| CN | 112038375 A | 12/2020 |
| CN | 112470287 A | 3/2021 |
| CN | 113097267 A | 7/2021 |
| CN | 113471271 A | 10/2021 |
| TW | M555482 U | 2/2018 |
| WO | 2022110173 A1 | 6/2022 |

* cited by examiner

*Primary Examiner* — Elmito Breval
(74) *Attorney, Agent, or Firm* — HSML P.C.

(57) ABSTRACT

A display panel is provided by the present application. The display panel includes a plurality of first sub-pixels, a plurality of second sub-pixels, and a plurality of third sub-pixels. Center points of at least part of the plurality of first sub-pixels are arranged in a first column along a first direction, center points of at least part of the plurality of second sub-pixels are arranged in a second column along the first direction, and center points of at least part of the plurality of third sub-pixels are arranged in a third column along the first direction. One of the first sub-pixels in the first column is arranged between adjacent two of the second sub-pixels in the second column, and the one of the first sub-pixels in the first column is partially overlapped with the adjacent two of the second sub-pixels in the second column along the first direction.

18 Claims, 7 Drawing Sheets

DISPLAY PANEL

BACKGROUND OF INVENTION

Field of Invention

The present application relates to a field of display technology, in particular to a display panel.

Description of Prior Art

Organic light-emitting display panels have advantages of self-illumination without backlight, low power, high brightness, and small size, and are widely used in various electronic devices, and are favored by users.

An arrangement of pixels directly affects a display performance of the organic light-emitting display panels. In order to obtain an organic light-emitting display panel with better display effect, the arrangement of the pixels has become a research hotspot in a field of organic light-emitting displays. There are many kinds of arrangements of the pixels commonly used in the organic light-emitting display panel in the prior art, but an existing organic light-emitting display panel cannot take into account a linearity of a display image and a higher image clarity and softness, and a display effect is poor.

SUMMARY OF INVENTION

Embodiments of the present application provide a display panel, which enables the display panel to take into account a linearity of a display image and a higher image clarity and softness, thereby improving a display quality.

The embodiments of the present application provide a display panel, including a plurality of first sub-pixels configured to display a first color, a plurality of second sub-pixels configured to display a second color, and a plurality of third sub-pixels configured to display a third color, wherein the first color, the second color, and the third color are all different;

wherein center points of at least part of the plurality of first sub-pixels are arranged in a first column along a first direction, center points of at least part of the plurality of second sub-pixels are arranged in a second column along the first direction, and center points of at least part of the plurality of third sub-pixels are arranged in a third column along the first direction, the first column and the second column are both arranged on a side of the third column;

one of the first sub-pixels in the first column is arranged between adjacent two of the second sub-pixels in the second column along the first direction, and the one of the first sub-pixels in the first column and one of the adjacent two of the second sub-pixels in the second column are partially overlapped along the first direction; and one of the third sub-pixels in the third column and the one of the first sub-pixels in the first column are at least partially overlapped with one of the adjacent two of the second sub-pixels in the second column along a second direction.

Optionally, in some embodiments provided in the present application, wherein center points of at least part of the plurality of first sub-pixels are arranged in a fourth column along the first direction, wherein the first column, the second column, and the fourth column are all arranged on a side of the third column, and the first column and the fourth column are arranged on two sides of the second column, respectively; and one of the first sub-pixels in the fourth column is located between other adjacent two of the second sub-pixels in the second column, and the one of the first sub-pixels in the fourth column and one of the other adjacent two of the second sub-pixels in the second column are partially overlapped along the first direction.

Optionally, in some embodiments provided in the present application, wherein one of the third sub-pixels in the third column and the one of the first sub-pixels in the fourth column are at least partially overlapped with one of the other adjacent two of the second sub-pixels in the second column along the second direction.

Optionally, in some embodiments provided in the present application, wherein center points of at least part of the plurality of first sub-pixels are arranged in an eleventh column along the first direction, center points of a part of the plurality of second sub-pixels are arranged in a twelfth column along the first direction, center points of a part of the plurality of the third sub-pixels are arranged in a thirteenth column along the first direction, and center points of a part of the plurality of first sub-pixels are arranged in a fourteenth column along the first direction, wherein the eleventh column, the twelfth column, and the fourteenth column are all arranged on a side of the thirteenth column, the eleventh column and the fourteenth column are arranged on two sides of the twelfth column; the eleventh column, the twelfth column, the thirteenth column and the fourteenth column are all arranged on another side of the third column;

wherein a center point of the one of the first sub-pixels in the first column adjacent to the third sub-pixels in the third column, a center point of the one of the first sub-pixels in the fourth column adjacent to the third sub-pixels in the third column, a center point of the one of the first sub-pixels in the eleventh column adjacent to the third sub-pixels in the third column, and a center point of the one of the first sub-pixels in the fourteenth column adjacent to the third sub-pixels in the third column form an isosceles trapezoid or a parallelogram.

Optionally, in some embodiments provided in the present application, wherein center points of at least part of the plurality of first sub-pixels arranged in the eleventh column along the first direction, center points of at least part of the plurality of second sub-pixels arranged in the twelfth column along the first direction, and center points of at least part of the plurality of third sub-pixels arranged in the thirteenth column along the first direction, wherein the eleventh column and the twelfth column are all arranged on a side of the thirteenth column, and the eleventh column, the twelfth column and the thirteenth column are all arranged on another side of the third column;

wherein center points of adjacent two of the first sub-pixels in the first column, center points of adjacent two of the first sub-pixels in the eleventh column adjacent to the third sub-pixels in the third column form a first virtual quadrilateral;

center points of adjacent two of the second sub-pixels in the second column and center points of adjacent two of the second sub-pixels in the twelfth column adjacent to the third sub-pixels in the third column form a second virtual quadrilateral;

wherein the first virtual quadrilateral and the second virtual quadrilateral are both rectangular.

Optionally, in some embodiments provided in the present application, wherein the first column is arranged on a side of the second column away from the third column, the eleventh column is arranged between the twelfth column and the third column, and an area of the first virtual quadrilateral is less than an area of the second virtual quadrilateral;

or, the first column is arranged between the second column and the third column, the eleventh column is arranged on the side of the twelfth column away from the third column, and the area of the first virtual quadrilateral is less than the area of the second virtual quadrilateral.

Optionally, in some embodiments provided in the present application, wherein the second column is arranged on a side of the first column away from the third column, and the twelfth column is arranged on a side of the eleventh column away from the thirteenth column; and an area of the first virtual quadrilateral is greater than or equal to an area of the second virtual quadrilateral.

Optionally, in some embodiments provided in the present application, wherein the second column and the twelfth column are arranged between the first column and the eleventh column; an area of the first virtual quadrilateral is greater than an area of the second virtual quadrilateral.

Optionally, in some embodiments provided in the present application, wherein center points of a part of the plurality of first sub-pixels are arranged in the second column along the first direction, center points of a part of the plurality of first sub-pixels are arranged in an eleventh column along the first direction, and a part of the plurality of the second sub-pixels are arranged in an eleventh column along the first direction, center points of a part of the plurality of second sub-pixels and center points of a part of the plurality of first sub-pixels are arranged in a twelfth column along the first direction, center points of a part of the plurality of third sub-pixels are arranged in a thirteenth column along the first direction, the eleventh column and the twelfth column are all arranged on a side of the thirteenth column, and the eleventh column, the twelfth column, and the thirteenth column are all arranged on another side of the third column; wherein, one of the first sub-pixels located in the second column arranged between adjacent two of the second sub-pixels, and one of the first sub-pixels in the twelfth column is arranged between two adjacent second sub-pixels;

wherein a center point of one of the first sub-pixels in the first column, a center point of one of the first sub-pixels in the second column, a center point of one of the first sub-pixels in the eleventh column, and a center point of one of the first sub-pixels in the twelfth column adjacent to the third sub-pixels in the third column form a trapezoid or a parallelogram;

center points of adjacent two of the second sub-pixels in the second column and center points of adjacent two of the second sub-pixels in the twelfth column adjacent to the third sub-pixels in the third column form a second virtual quadrilateral.

Optionally, in some embodiments provided in the present application, wherein areas of the third sub-pixels are greater than areas of the first sub-pixels, and areas of the third sub-pixels are greater than areas of the second sub-pixels.

Correspondingly, the embodiments of the present application also provide a display panel, including a plurality of repeating units arranged in an array, wherein each of the repeating units includes four first sub-pixels configured to display a first color, four second sub-pixels configured to display a second color, and a plurality of third sub-pixels configured to display a third color, the first color, the second color, and the third color are all different;

wherein a part of a plurality of the third sub-pixels among the plurality of third sub-pixels form a first pixel column along a first direction, and another part of the third sub-pixels form a second sub-pixel column along the first direction in the repeating units, the first pixel column is located at a side of the second pixel column; the first sub-pixels and the second sub-pixels are arranged on two sides of the first pixel column in the repeating units; and connection lines of center points of the four first sub-pixels on two sides of the first pixel column form a first virtual quadrilateral, and connection lines of center points of the four second sub-pixels on two sides of the first pixel column form a second virtual quadrilateral;

wherein a first side of the second virtual quadrilateral on a side of the first pixel column does not overlap with an extension line of a second side of the first virtual quadrilateral on the side of the first pixel column.

Optionally, in some embodiments provided in the present application, wherein the first side of the second virtual quadrilateral is parallel to the second side of the first virtual quadrilateral.

Optionally, in some embodiments provided in the present application, wherein a connection line connecting center points of a part of the plurality of third sub-pixels in the first pixel column defines a first virtual axis; and the first side and the second side are parallel to the first virtual axis.

Optionally, in some embodiments provided in the present application, wherein a first distance between the first side and the first virtual axis is less than or greater than a second distance between the second side and the first virtual axis.

Optionally, in some embodiments provided in the present application, wherein a third side of the second virtual quadrilateral located on the another side of the first pixel column is parallel to a fourth side of the first virtual quadrilateral located on another side of the first pixel column; and a third distance between the third side and the first virtual axis is less than or greater than a fourth distance between the fourth side and the first virtual axis.

Optionally, in some embodiments provided in the present application, wherein an extension line of the first side of the second virtual quadrilateral intersects the second side of the first virtual quadrilateral.

Optionally, in some embodiments provided in the present application, wherein a connection line connecting center points of a part of the plurality of third sub-pixels in the first pixel column is a first virtual axis;

the first side is parallel to the first virtual axis, and an extension line of the second side of the first virtual quadrilateral intersects the first virtual axis.

Optionally, in some embodiments provided in the present application, wherein a first distance is defined between the first side of the second virtual quadrilateral and the first virtual axis;

a fifth distance and a sixth distance are defined between two end points of the second side of the first virtual quadrilateral and the first virtual axis;

the fifth distance is less than or equal to the first distance, and the sixth distance is greater than or equal to the first distance.

Optionally, in some embodiments provided in the present application, wherein an extension line of the third side of the second virtual quadrilateral located on another side of the first pixel column is intersected with the fourth side of the first virtual quadrilateral located on the another side of the first pixel column;

a third distance is defined between the third side of the second virtual quadrilateral and the first virtual axis, a seventh distance and an eighth distance are defined between two end points of the fourth side of the first virtual quadrilateral and the first virtual axis, the seventh distance is less than or equal to the third distance, and the eighth distance is greater than or equal to the third distance.

Optionally, in some embodiments provided in the present application, wherein areas of the third sub-pixels are larger than areas of the first sub-pixels, and areas of the third sub-pixels are larger than areas of the second sub-pixels.

Advantageous Effects

The embodiments of the present application provide the display panel, the display panel includes the plurality of first sub-pixels configured to display the first color, the plurality of second sub-pixels configured to display the second color, and the plurality of third sub-pixels configured to display the third color, the first color, the second color, and the third color are all different. The center points of the at least part of the plurality of first sub-pixels are arranged in the first column along the first direction, the center points of the at least part of the plurality of second sub-pixels are arranged in the second column along the first direction, and the center points of the at least part of the plurality of third sub-pixels are arranged in the third column along the first direction. Both the first column and the second column are arranged on the side of the third column. The one of the first sub-pixels in the first column is arranged between the adjacent two of the second sub-pixels in the second column along the first direction, and the one of the first sub-pixels in the first column is partially overlapped with the one of the adjacent two of the second sub-pixels in the second column along the first direction. One of the third sub-pixels in the third column is at least partially overlapped with the one of the first sub-pixels in the first column and one of the adjacent two of the second sub-pixels in the second column along the second direction, and the first direction and the second direction intersect. In the embodiment of the present application, the center points of the first sub-pixels and the center points of the second sub-pixels are arranged in two columns in the first direction, so that overlaps between the first sub-pixels and the second sub-pixels in the first direction can be reduced, and the charge propagation path between the first sub-pixels and the second sub-pixels can be reduced, Further, the leakage current between the first sub-pixels and the second sub-pixels are improved, the phenomenon of "light stealing" of the sub-pixels of the display panel is improved, and the display quality is improved.

BRIEF DESCRIPTION OF DRAWINGS

In order to more clearly illustrate the embodiments or the technical solutions of the existing art, the drawings illustrating the embodiments, or the existing art will be briefly described below. The drawings in the following description merely illustrate some embodiments of the present application. Other drawings may also be obtained by those skilled in the art according to these figures without paying creative work.

DETAILED DESCRIPTION OF PREFERRED EMBODIMENTS

Figure 1:
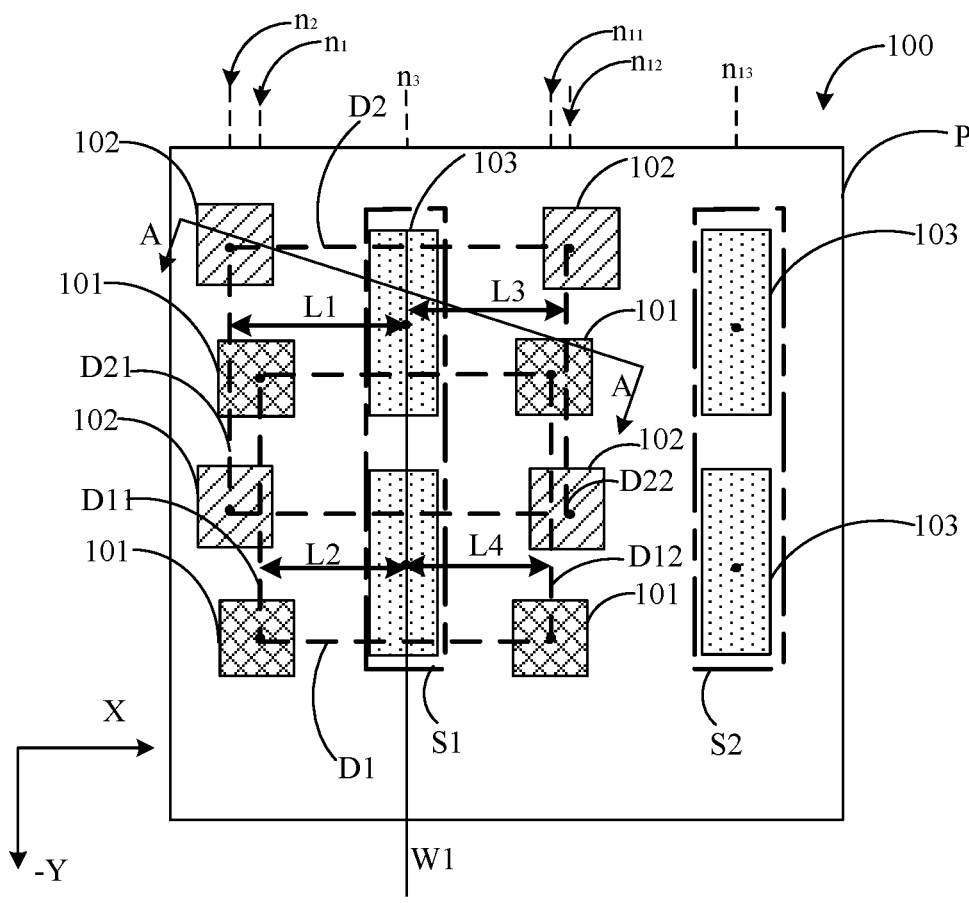
FIG. 1 is a first schematic plan view of a display panel provided by an embodiment of the present application.

In order to make the objective, technical solution, and advantages of the present application clearer, the present application will be further described in detail below with reference to the accompanying drawings. Referring to the figures in the accompanying drawings. The components with the same reference numbers represent the same or similar components. The following description is based on the illustrated specific embodiments of the present disclosure and should not be construed to limit the other specific embodiments which are not described in detail herein. The word "embodiment" configured in this specification means an example, example, or illustration.

In the description of the present disclosure, it is to be understood that the azimuth or positional relationships indicated by the terms "center", "longitudinal", "transverse", "length", "width", "thickness", "upper", "lower", "front", "back", "left", "right", "vertical", "horizontal", "top", "bottom", "inside", "outside", "clockwise", "counter-clockwise", etc., are based on the azimuth or positional relationship shown in the drawings, merely for the purpose of assisting and simplify the description, rather than indicating or implying that the indicated device or element must have a specific orientation, and be constructed and operated in a particular orientation. Therefore, these terms cannot be construed as limiting the present disclosure. In addition, the terms "first" and "second" are only configured for descriptive purposes and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

Embodiments of the present application provide a display panel and an intelligent terminal. Each will be described in detail below. It should be noted that the description order of the following embodiments is not intended to limit the preferred order of the embodiments.

The display panel provided by the present application will be described in detail below through specific embodiments.

It is known that an organic light-emitting display panel includes anodes, an organic light-emitting material layer, and a cathode which are arranged in sequence. When appropriate voltages are applied to the anodes and the cathode respectively, holes of the anodes and electrons of the cathode will combine in the organic light-emitting material layer to produce light. At this time, carriers migrate longitudinally between the anodes and the cathode. In a working process of the display panel provided by the prior art, the carriers will spread laterally to its adjacent organic light-emitting diodes, causing corresponding sub-pixels to emit light, this phenomenon is called "light stealing". The phenomenon of "light stealing" will make the organic light-emitting display panel unable to take into account the linearity of the display image and the higher image clarity and softness, resulting in poor display effect of the display panel.

The embodiments of the present application provide the display panel, which is used to reduce a charge propagation path between adjacent first sub-pixels and second sub-pixels, thereby improving leakage currents between the first sub-pixels and the second sub-pixels, thereby improving the phenomenon of "light stealing" of the sub-pixels of the display panel and improving the display quality.

Please refer to FIG. 1, FIG. 1 is a first schematic plan view of the display panel provided by the embodiment of the present application. The embodiment of the present application provides a display panel 100, the display panel 100 includes a plurality of first sub-pixels 101 configured to display a first color, a plurality of second sub-pixels 102 configured to display a second color, and a plurality of third sub-pixels 103 configured to display a third color; the first color, the second color, and the third color are all different. Center points of at least part of the plurality of first sub-pixels 101 are arranged in a first column $n_1$ along a first direction, center points of at least part of the plurality of second sub-pixels 102 are arranged in a second column $n_2$ along the first direction, and center points of at least part of the plurality of third sub-pixels 103 are arranged in the third column $n_3$ along the first direction. The first column $n_1$ and the second column $n_2$ are both arranged on a side of the third column $n_3$. One of the first sub-pixels 101 in the first column $n_1$ is arranged between adjacent two of the second sub-pixels 102 in the second column $n_2$ along the first direction, and the one of the first sub-pixels 101 in the first column $n_1$ and one of the adjacent two of the second sub-pixels 102 in the second column $n_2$ are partially overlapped along the first direction. One of the third sub-pixels 103 in the third column $n_3$ and the one of the first sub-pixels 101 in the first column $n_1$ are at least partially overlapped with one of the adjacent two of the second sub-pixels 102 in the second column $n_2$ along a second direction, and the first direction intersect with the second direction.

It can be understood that in the embodiment of the present application, the display panel 100 includes a plurality of repeating units P arranged in an array, each of the repeating units P includes four first sub-pixels 101 configured to display the first color, four second sub-pixels 102 configured to display the second color, and the plurality of third sub-pixels 103 configured to display the third color. In the repeating units P, a part of the plurality of the third sub-pixels 103 form a first pixel column S1 along the first direction, and another part of the plurality of the third sub-pixels 103 form a second sub-pixel column S2 along the first direction. The first pixel column S1 is located on a side of the second sub-pixel column S2, and the first pixel column S1 and the second sub-pixel column S2 are arranged along the second direction. The first sub-pixels 101 and the second sub-pixels 102 are arranged on two sides of the first pixel column S1 in the repeating units P. Among them, connection lines of center points of the four first sub-pixels 101 located on two sides of the first pixel column S1 form a first virtual quadrilateral D1, and connection lines of center points of the four second sub-pixels 102 located on two sides of the first pixel column S1 form a second virtual quadrilateral D2. A first side D21 of the second virtual quadrilateral D2 on a side of the first pixel column S1 does not overlap with an extension line of a second side D11 of the first virtual quadrilateral D1 on the side of the first pixel column S1.

It should be understood that in the embodiment of the present application, each of the repeating units P includes at least four third sub-pixels 103 configured to display the third color. It can be understood that in each of the repeating units P, one of the first sub-pixels 101, one of the second sub-pixels 102 and at least one third sub-pixel 103 form a pixel unit, that is, the pixel unit may include the plurality of third sub-pixels 103, when a number of third sub-pixels in one pixel unit is a plurality, the plurality of third sub-pixels 103 may share an anode. This can make an arrangement of pixels more compact and improve the pixel resolution of the display panel 100.

In the embodiment of the present application, the first side D21 of the second virtual quadrilateral D2 is parallel to the second side D11 of the first virtual quadrilateral D1. A connection line of center points of the part of the plurality of third sub-pixels 103 in the first pixel column S1 defines a first virtual axis W1. The first side D21 and the second side D11 are parallel to the first virtual axis W1.

Further, a first distance L1 between the first side D21 and the first virtual axis W1 is greater than a second distance L2 between the second side D11 and the first virtual axis W1.

In a working process of an existing display panel, the carriers will spread laterally to its adjacent organic light-emitting diodes, causing corresponding sub-pixels to emit light, and the phenomenon of "light stealing" occurs, so that the display panel 100 is unable to take into account the linearity of the display image and the higher image clarity and softness, resulting in poor display effect of the display panel 100. In the embodiment of the present application, the second column $n_2$, the first column $n_1$, and the third column $n_3$ are arranged in order along the second direction, and the first sub-pixels 101 in the first column $n_1$ are shifted to a side close to the third sub-pixels 103 in the third column $n_3$, that is, the first sub-pixels 101 and the second sub-pixels 102 are arranged in different columns, that is, a distance between the first sub-pixels 101 and the third sub-pixels 103 located on a same side of the first virtual axis W1 is different from a distance between the second sub-pixels 102 and the third sub-pixels 103, so that an overlap between the first sub-pixels 101 and the second sub-pixels 102 in the first direction can be reduced, and the charge propagation path between the first sub-pixels 101 and the second sub-pixels 102 can be reduced, Further, the leakage current between the first sub-pixels 101 and the second sub-pixels 102 are improved, the phenomenon of "light stealing" of the sub-pixels of the display panel 100 is improved, and the display quality is improved.

It should be noted that in the embodiment of the present application, the sub-pixels partially overlap refers to partial correspondence of the sub-pixels in the first direction or the second direction.

It should be understood that the first direction is a direction extending along a −Y axis, and the second direction is a direction extending along an X axis. Optionally, the first direction and the second direction intersect vertically, which may be specifically set according to specifications of the display panel 100. Of course, in some embodiments, the second direction may also be the direction extending along the −Y axis, and the first direction may be the direction extending along the X axis. It should be noted that in the embodiments of the present application, the first direction is the direction extending along the −Y axis, and the second direction is the direction extending along the X axis for example, but it should not be construed as a limitation of the present application.

It should be noted that in the embodiments of the present application, center points of the sub-pixels refer to geometric centers of the sub-pixels.

Please continue to refer to FIG. 1, In the embodiment of the present application, the center points of at least part of the plurality of first sub-pixels 101 are arranged in an eleventh column $n_{11}$ along the first direction. The center points of at least part of the plurality of second sub-pixels 102 are arranged in a twelfth column $n_{12}$ along the first direction. The center points of at least part of the plurality of third sub pixels 103 are arranged in a thirteenth column $n_{13}$ along the first direction. The eleventh column $n_{11}$ and the twelfth column $n_{12}$ are arranged on the side of the thirteenth column $n_{13}$, and the eleventh column $n_{11}$, the twelfth column $n_{12}$ and the thirteenth column $n_{13}$ are all arranged on another side of the third column $n_3$. Center points of adjacent two of the first sub-pixels 101 in the first column $n_1$ adjacent to the third sub-pixels 103 in the third column $n_3$ and adjacent two of the first sub-pixels 101 in the eleventh column $n_{11}$ form the first virtual quadrilateral D1. Center points of adjacent two of the second sub-pixels 102 in the second column $n_2$ adjacent to the third sub-pixels 103 in the third column $n_3$ and adjacent two of the second sub-pixels 102 in the twelfth column n 12 form the second virtual quadrilateral D2.

In the embodiment of the present application, the first column $n_1$ is arranged between the second column $n_2$ and the third column $n_3$, and the eleventh column $n_{11}$ is arranged on a side of the twelfth column $n_{12}$ away from the thirteenth column $n_{13}$. The first virtual quadrilateral D1 and the second virtual quadrilateral D2 are both rectangular, wherein an area of the first virtual quadrilateral D1 is less than an area of the second virtual quadrilateral D2.

It can be understood that a third side D22 of the second virtual quadrilateral D2 located on another side of the first pixel column S1 is parallel to a fourth side D12 of the first virtual quadrilateral D1 located on the another side of the first pixel column S1. A third distance L3 between the third side D22 and the first virtual axis W1 is greater than a fourth distance L4 between the fourth side D12 and the first virtual axis W1.

In some embodiments, the first distance L1 is equal to the third distance L3, and the second distance L2 is equal to the fourth distance L4.

That is, in the embodiment of the present application, the first sub-pixels 101 located in the first column $n_1$ are shifted to the side close to the third sub-pixels 103 in the third column $n_3$, and the first sub-pixels 101 located in the eleventh column $n_{11}$ are shifted to the side close to the third sub-pixels 103 in the third column $n_3$, that is, a distance between one of the first sub-pixels 101 and one of the third sub-pixels 103 on another side of the first virtual axis W1 is also different from a distance between one of the second sub-pixels 102 and one of the third sub-pixels 103 on the another side of the first virtual axis W1 along the second direction. In the embodiment of the present application, the center points of the first sub-pixels 101 and the center points of the second sub-pixels 102 are arranged in two columns in the first direction by reducing distances corresponding to the first sub-pixels 101 and the third sub-pixels 103 in the first direction, Further, it is possible to reduce the overlap between the first sub-pixels 101 and the second sub-pixels 102 in the first direction, and the charge propagation path between the first sub-pixels 101 and the second sub-pixels 102 can be reduced, thereby improving the leakage current between the first sub-pixels 101 and the second sub-pixels 102, thereby improving the phenomenon of "light stealing" of the sub-pixels, and improving the display quality of the display panel 100.

In the embodiment of the present application, the first sub-pixels 101 are green sub-pixels, the second sub-pixels 102 are red sub-pixels, and the third sub-pixels 103 are blue sub-pixels. Alternatively, the first sub-pixels 101 may be the red sub-pixels, the second sub-pixels 102 may be the green sub-pixels, and the third sub-pixels 103 may be the blue sub-pixels. That is, in the present application, the red sub-pixels and the green sub-pixels are partially staggered in the first direction, reducing overlapping areas of the red sub-pixels and the green sub-pixels in the first direction, thereby improving the phenomenon of "light stealing" and improving the display quality of the display panel 100.

In the embodiment of the present application, areas of the third sub-pixels 103 are greater than areas of the first sub-pixels 101, and the areas of the third sub-pixels 103 are greater than areas of the second sub-pixels 102. In this embodiment, the third sub-pixels 103 are the blue sub-pixels. Because a reflection intensity of the blue sub-pixels is weak, the embodiment of the present application increases light emission areas of the third sub-pixels 103 by increasing the areas of the third sub-pixels 103, so that light intensities of the third sub-pixels 103, the first sub-pixel 101, and the second sub-pixel 102 are similar, and purities of three primary colors are improved, thereby further improving the display quality of the display panel 100.

Figure 2:
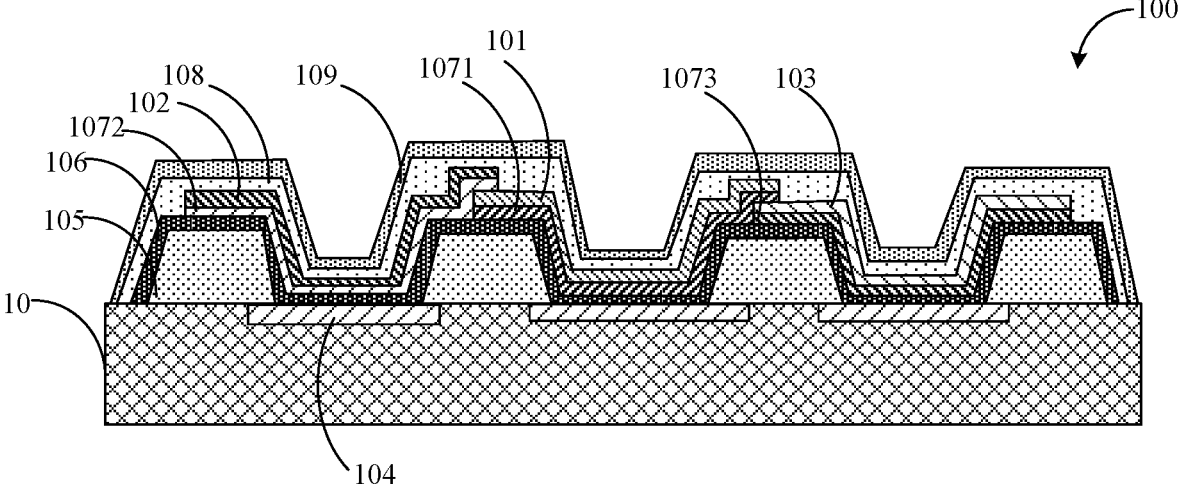
FIG. 2 is a first cross-sectional schematic structural diagram of the display panel taken along line A-A of FIG. 1.

Please refer to FIG. 2, FIG. 2 is a first cross-sectional schematic structural diagram of the display panel taken along line A-A of FIG. 1. The display panel 100 further includes a driving substrate 10, anodes 104, a pixel definition layer 105, a hole function layer 106, a first adjustment layer 1071, a second adjustment layer 1072, a third adjustment layer 1073, an electron function layer 108, and a cathode 109.

The anodes 104 are disposed on the driving substrate 10 and connected to the driving substrate 10. The driving substrate 10 is provided with a functional layer such as a driving transistor to drive the sub-pixels to emit light normally. For example, the driving substrate includes but is not limited to a substrate, a light shielding layer disposed on the substrate, a buffer layer disposed on the substrate and covering the light shielding layer, and an active layer, a gate insulating layer, and a gate electrode disposed on the buffer layer in order from bottom to top, and an interlayer dielectric layer disposed above the buffer layer and covering the source layer, the gate insulating layer and the gate electrode, wherein the active layer includes a channel region, and a source region and a drain region on two sides of the channel region. Source electrodes disposed on the interlayer dielectric layer and the source region are electrically connected. Drain electrodes disposed on the interlayer dielectric layer are electrically connected to the drain region. The source electrodes and the drain electrodes may also be covered with a passivation layer and/or a planarization layer arranged in layers. The anode is disposed on the passivation layer or the planarization layer.

The pixel definition layer 105 is provided on the driving substrate 10, and the pixel definition layer has openings, and the openings expose surfaces of the anodes 104.

The hole function layer 106 is disposed on an entire surface of the pixel definition layer 105 and covers the openings.

The first adjustment layer 1071, the second adjustment layer 1072, and the third adjustment layer 1073 are respectively arranged at portions corresponding to the openings of the hole function layer 106, and the first sub-pixels 101 are arranged at a side of the first adjustment layer 1071 away from the anodes 104, the second sub-pixels 102 are arranged at a side of the second adjustment layer 1072 away from the anodes 104, and the third sub-pixels 103 are arranged at a side of the third adjustment layer 1073 away from the anodes 104. In the embodiment of the present application, the first adjustment layer 1071 is arranged between the first sub-pixels 101 and corresponding anodes 104, the second adjustment layer 1072 is arranged between the second sub-pixels 102 and the corresponding anodes 104, and the third adjustment layer 1073 is arranged between the third sub-pixels 103 and the corresponding anodes 104. The first adjustment layer 1071, the second adjustment layer 1072, and the third adjustment layer 1073 are respectively used to adjust cavity lengths of the first sub-pixels 101, the second sub-pixels 102 and the third sub-pixels 103, thereby adjusting viewing angle attenuation of each of the sub-pixels, and increasing color gamut of the sub-pixels.

In some embodiments, a thickness of the first adjustment layer 1071 is less than a thickness of the second adjustment layer 1072. The thickness of the first adjustment layer 1071 is greater than a thickness of the third adjustment layer 1073.

In some embodiments, the thickness of the first adjustment layer 1071 is less than or equal to 1000 angstroms. Preferably, the thickness of the first adjustment layer 1071 is between 200 angstroms and 500 angstroms. For example, the thickness of the first adjustment layer 1071 may be any one of 250 angstroms, 280 angstroms, 320 angstroms, 400 angstroms, 450 angstroms, or 500 angstroms.

In some embodiments, the thickness of the second adjustment layer 1072 is less than or equal to 1000 angstroms. Preferably, the thickness of the second adjustment layer 1072 is between 500 angstroms and 850 angstroms. For example, the thickness of the second adjustment layer 1072 may be any one of 500 angstroms, 550 angstroms, 650 angstroms, 700 angstroms, 750 angstroms, 820 angstroms, or 850 angstroms.

In some embodiments, thicknesses of the first sub-pixels 101 are between 100 angstroms and 400 angstroms, and in one embodiment, the thicknesses of the first sub-pixels 101 are 340 angstroms. Thicknesses of the second sub-pixels 102 are between 300 angstroms and 500 angstroms, in one embodiment, the thicknesses of the second sub-pixel 102 are 450 angstroms. Thicknesses of the third sub-pixels 103 are between 50 angstroms and 300 angstroms, in one embodiment, the thicknesses of the third sub-pixels 103 are 250 angstroms.

The electron functional layer 108 is disposed on a side of the hole functional layer 106 away from the driving substrate 10, and covers the first sub-pixels 101, the second sub-pixels 102, and the third sub-pixels 103.

The cathode 109 covers a side of the electronic functional layer 108 away from the drive substrate 10.

When adjacent the first sub-pixels 101 and the second sub-pixels 102 have a same evaporation process of pixel positional accuracy (PPA), an overlapping area of the first adjustment layer 1071 and the second adjustment layer 1072 is reduced, which is beneficial to reduce a degree of "light stealing".

In addition, since film layers of the second sub-pixels 102 are thick, shadows of the second sub-pixels 102 increase rapidly during the evaporation process, resulting in a continuous increase of the overlapping areas of the adjacent first sub-pixels 101 and the second sub-pixels 102; in a case of a same PPA offset, keeping distances between the second sub-pixels 102 and the surrounding sub-pixels larger is beneficial to improve the overlapping areas between the second sub-pixels 102 and adjacent the sub-pixels, and is beneficial to improving the degree of "light stealing".

Figure 3:
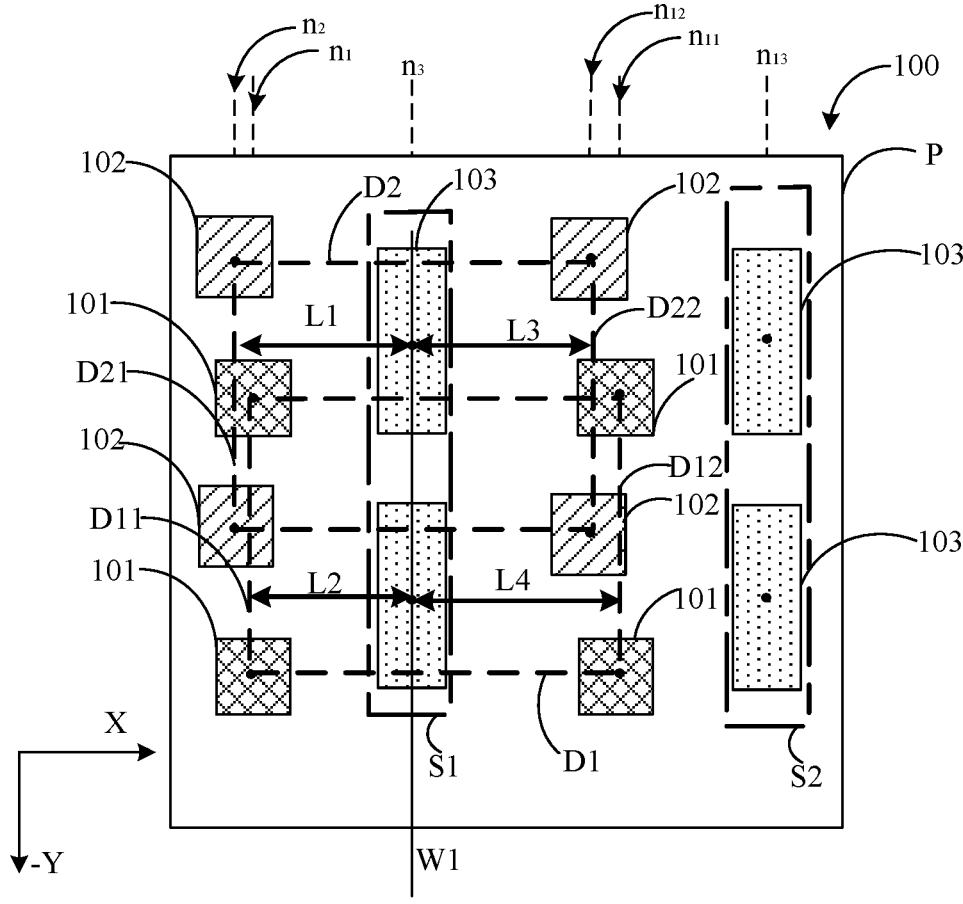
FIG. 3 is a second schematic plan view of the display panel provided by the embodiment of the present application.

Please refer to FIG. 3, FIG. 3 is a second schematic plan view of the display panel provided by the embodiment of the present application. A difference between the display panel 100 provided in the embodiment of the present application and the display panel 100 provided in FIG. 1 is that the twelfth column $n_{12}$ is arranged on a side of the eleventh column $n_{11}$ away from the thirteenth column $n_{13}$. The center points of the adjacent two of the first sub-pixels 101 in the first column $n_1$ adjacent to the third sub-pixels 103 in the third column n 3 and the adjacent two of the first sub-pixels 101 in the eleventh column $n_{11}$ form the first virtual quadrilateral D1; The center points of the adjacent two of the second sub-pixels 102 in the second column $n_2$ adjacent to the third sub-pixels 103 in the third column $n_3$ and the adjacent two of the second sub-pixels 102 in the twelfth column $n_{12}$ form the second virtual quadrilateral D2; the first virtual quadrilateral D1 and the second virtual quadrilateral D2 are both rectangular, wherein the area of the first virtual quadrilateral D1 is greater than or equal to the area of the second virtual quadrilateral D2.

It can be understood that in the embodiment of the present application, the first distance L1 between the first side D21 and the first virtual axis W1 is greater than the second distance L2 between the second side D11 and the first virtual axis W1. The third side D22 of the second virtual quadrilateral D2 located on the another side of the first pixel column S1 is parallel to the fourth side D12 of the first virtual quadrilateral D1 located on the another side of the first pixel column S1. The third distance L3 between the third side D22 and the first virtual axis W1 is less than the fourth distance L4 between the fourth side D12 and the first virtual axis W1.

In some embodiments, the first distance L1 is equal to the fourth distance L4, and the second distance L2 is equal to the third distance L3.

That is, in the embodiment of the present application, the first sub-pixels 101 in the first column $n_1$ are shifted to the side close to the third sub-pixels 103 in the third column $n_3$, and the first sub-pixels 101 in the eleventh column $n_{11}$ are shifted to a side close to the third sub-pixels 103 in the thirteenth column n 13. The embodiment of the present application shift the first sub-pixels 101 in the first column $n_1$ and the first sub-pixels 101 in the eleventh column $n_{11}$ in a same direction, that is, the distances between the first sub-pixels 101 and the third sub-pixels 103 on a same side of the first virtual axis W1 and the distances between the second sub-pixels 102 and the third sub-pixels 103 are also different in the second direction, so that the first sub-pixels 101 and the second sub-pixels 102 are partially offset in the first direction, thereby improving the phenomenon of "light stealing" of the sub-pixels and improving the display quality of the display panel 100.

In the embodiment of the present application, since the center points of the first sub-pixels 101 are all offset in the same direction, when the areas of the first sub-pixels 101 and the areas of the second sub-pixels 102 are same and the area of the first virtual quadrilateral D1 and the area of the second virtual quadrilateral D2 are equal, the first sub-pixels 101 and the second sub-pixels 102 can be evaporated using a same mask, thereby saving a manufacturing cost of the display panel 100.

Figure 4:
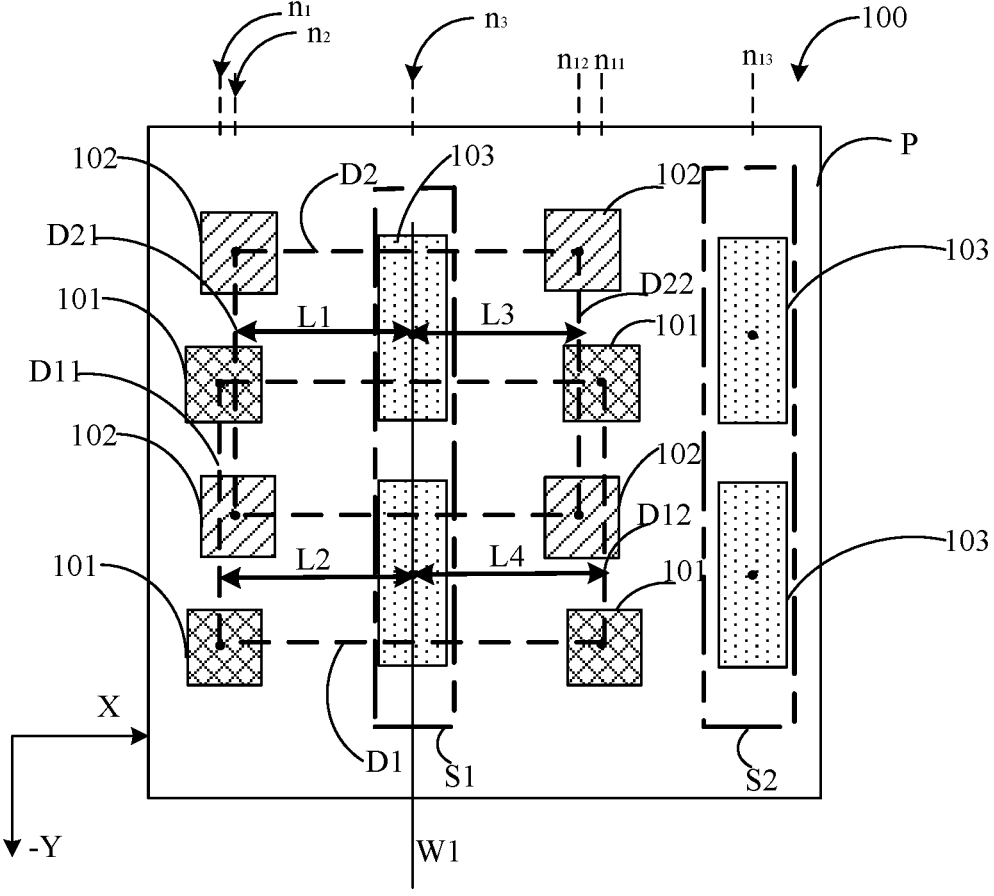
FIG. 4 is a third schematic plan view of the display panel provided by the embodiment of the present application.

Please refer to FIG. 4, FIG. 4 is a third schematic plan view of the display panel provided by the embodiment of the present application. A difference between the display panel 100 provided in the embodiment of the present application and the display panel 100 provided in FIG. 1 is that the first column $n_1$, the second column $n_2$, and the third column $n_3$ are sequentially arranged along the second direction. The eleventh column $n_{11}$ is arranged between the twelfth column $n_{12}$ and the thirteenth column $n_{13}$. That is, the second column $n_2$ and the twelfth column $n_{12}$ are arranged between the first column $n_1$ and the eleventh column $n_{11}$. The area of the first virtual quadrilateral D1 is greater than the area of the second virtual quadrilateral D2.

It can be understood that in the embodiment of the present application, the first distance L1 between the first side D21 and the first virtual axis W1 is less than the second distance L2 between the second side D11 and the first virtual axis W1. The third side D22 of the second virtual quadrilateral D2 located on the another side of the first pixel column S1 is parallel to the fourth side D12 of the first virtual quadrilateral D1 located on the another side of the first pixel column S1. The third distance L3 between the third side D22 and the first virtual axis W1 is less than the fourth distance L4 between the fourth side D12 and the first virtual axis W1.

In some embodiments, the first distance L1 is equal to the third distance L3, and the second distance L2 is equal to the fourth distance L4.

That is, in the embodiment of the present application, the first sub-pixels 101 in the first column $n_1$ are shifted to a side away from the third sub-pixels 103 in the third column $n_3$, and the first sub-pixels 101 in the eleventh column $n_{11}$ are shifted to the side close to the third sub-pixels 103 in the thirteenth column $n_{13}$. In the embodiments of the present application, the center points of the first sub-pixels 101 and the center points of the second sub-pixels 102 are arranged in two columns in the first direction, thereby reducing the overlaps between the first sub-pixels 101 and the second sub-pixels 102 in the first direction, reducing the charge propagation path between the first sub-pixels 101 and the second sub-pixels 102, thereby improving the leakage current between the first sub-pixels 101 and the second sub-pixels 102, thereby improving the phenomenon of "light stealing" of the sub-pixels and improving the display quality of the display panel 100.

Figure 5:
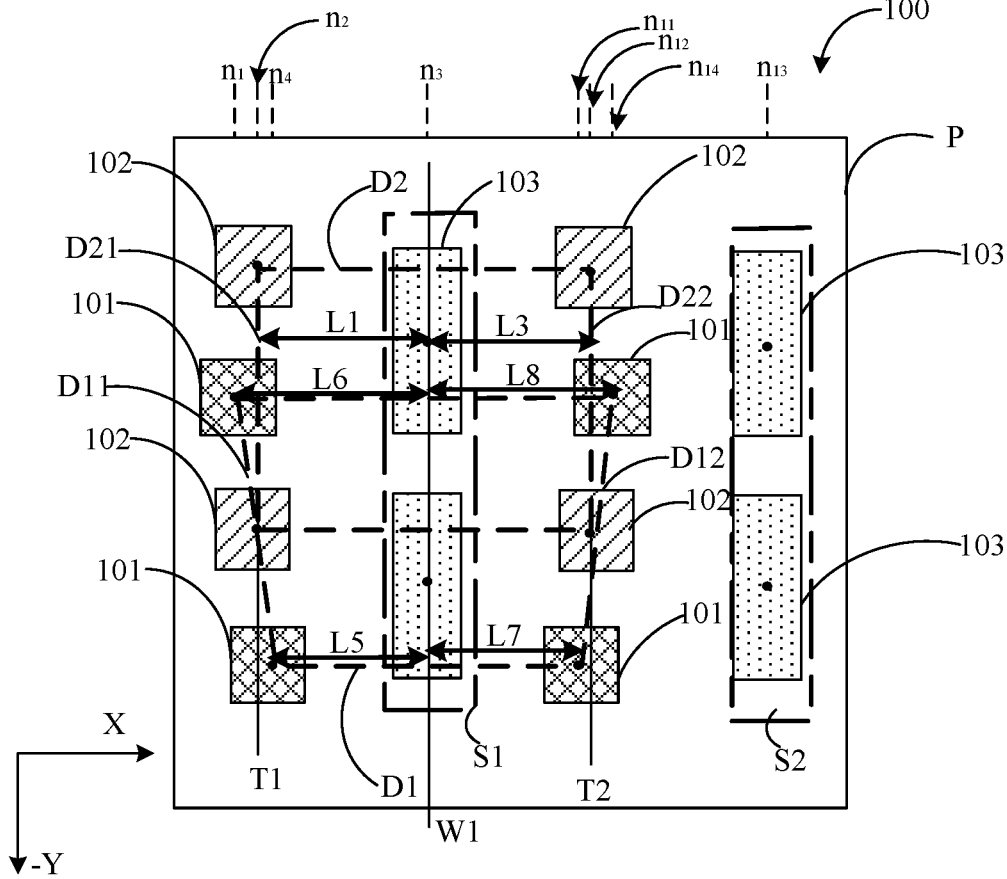
FIG. 5 is a fourth schematic plan view of the display panel provided by the embodiment of the present application.

Please refer to FIG. 5, FIG. 5 is a fourth schematic plan view of the display panel provided by the embodiment of the present application. A difference between the display panel 100 provided in the embodiment of the present application and the display panel 100 provided in FIG. 4 is that the center points of at least part of the plurality of first sub-pixels 101 are arranged in a fourth column $n_4$ along the first direction, and the first column $n_1$, the second column $n_2$, and the fourth column $n_4$ are all located on the side of the third column $n_3$. The fourth column $n_4$ is located between the second column $n_2$ and the third column $n_3$. One of the first sub-pixels 101 in the fourth column $n_4$ is arranged between the adjacent two of the second sub-pixels 102 in the second column $n_2$ along the first direction, and the one of the first sub-pixels 101 in the fourth column $n_4$ is partially overlapped with one of the adjacent two of the second sub-pixels

102 in the second column $n_2$. The one of the first sub-pixels 101 in the fourth column $n_4$ is arranged between the adjacent two of the second sub-pixels 102 in the second column $n_2$ along the first direction, and the one of the first sub-pixels 101 in the fourth column $n_4$ is partially overlapped with the one of the first sub-pixels 101 in the first column $n_1$ along the first direction. The center points of at least part of the plurality of first sub-pixels 101 are arranged in the fourteenth column $n_{14}$ along the first direction, the eleventh column $n_{11}$, the twelfth column $n_{12}$, and the fourteenth column $n_{14}$ are all arranged on the side of the thirteenth column $n_{13}$, the eleventh column $n_{11}$ and the fourteenth column $n_{14}$ are arranged on two sides of the twelfth column $n_{12}$, and the eleventh column $n_{11}$, the twelfth column $n_{12}$, the thirteenth column $n_{13}$, and the fourteenth column $n_{14}$ are all arranged on the another side of the third column $n_3$.

That is, in the embodiment of the present application, the eleventh column $n_{11}$ is arranged between the third column $n_3$ and the thirteenth column $n_{13}$, the twelfth column $n_{12}$ is arranged between the eleventh column $n_{11}$ and the thirteenth column $n_{13}$, and the fourteenth column $n_{14}$ is arranged between the twelfth column $n_{12}$ and the thirteenth column $n_{13}$.

In the embodiment of the present application, the center point of the one of the first sub-pixels 101 in the first column $n_1$, center point of the one of the first sub-pixels 101 in the fourth column $n_4$, center point of the one of the first sub-pixels 101 in the eleventh column $n_{11}$, and center point of the one of the first sub-pixel 101 in the fourteenth column $n_{14}$ adjacent to the third sub-pixels 103 in the third column $n_3$ form the first virtual quadrilateral D1. The center points of the adjacent two of the second sub-pixels 102 in the second column $n_2$ adjacent to the third sub-pixels 103 in the third column $n_3$ and the adjacent two of the second sub-pixels 102 in the twelfth column $n_{12}$ form the second virtual quadrilateral D2, wherein, the first virtual quadrilateral D1 is an isosceles trapezoid or parallelogram, and the second virtual quadrilateral D2 is a rectangle.

It can be understood that in the embodiment of the present application, an extension line T1 of the first side D21 of the second virtual quadrilateral D2 intersects with the second side D11 of the first virtual quadrilateral D1. The first side D21 is parallel to the first virtual axis W1, and an extension line of the second side D11 of the first virtual quadrilateral D1 intersects the first virtual axis W1.

In the embodiment of the present application, the first distance L1 is defined between the first side D21 of the second virtual quadrilateral D2 and the first virtual axis W1. A fifth distance L5 and a sixth distance L6 are defined between two end points of the second side D11 of the first virtual quadrilateral D1 and the first virtual axis W1. The fifth distance L5 is less than the first distance L1 and the sixth distance L6 is greater than the first distance L1.

An extension line T2 of the third side D22 of the second virtual quadrilateral D2 located on the another side of the first pixel column S1 intersects with the fourth side D12 of the first virtual quadrilateral D1 located on the another side of the first pixel column S1. The third distance L3 is defined between the third side D22 of the second virtual quadrilateral D2 and the first virtual axis W1. A seventh distance L7 and an eighth distance L8 are defined between two end points of the fourth side D12 of the first virtual quadrilateral D1 and the first virtual axis W1.

The seventh distance L7 is less than the third distance L3 and the eighth distance L8 is greater than the third distance L3.

In some embodiments, the seventh distance L7 is equal to the fifth distance L5, and the sixth distance L6 is equal to the eighth distance L8.

That is, in the embodiment of the present application, the center points of the first sub-pixels 101 are arranged in four columns, the first sub-pixels 101 in the first column $n_1$ are shifted to the side away from the third sub-pixels 103 in the third column $n_3$, the first sub-pixels in the fourth column $n_4$ are shifted to the side close to the third sub-pixels 103 in the third column $n_3$, and the first sub-pixels 101 in the eleventh column $n_{11}$ are shifted to the side close to the third sub-pixels 103 in the third column $n_3$, The first sub-pixels in the fourteenth column $n_{14}$ are shifted to the side away from the third sub-pixels 103 in the third column $n_3$, so that the center point of the one of the first sub-pixels 101 in the first column $n_1$, the center point of the one of the first sub-pixels 101 in the fourth column $n_4$, the center point of the one of the first sub-pixels 101 in the eleventh column $n_{11}$, and the center point of the one of the first sub-pixels 101 in the fourteenth column $n_{14}$ form the isosceles trapezoid, so that the center points of the first sub-pixels 101 and the center points of the second sub-pixels 102 are arranged in two columns in the first direction, so that the overlaps between the first sub-pixels 101 and the second sub-pixels 102 in the first direction can be reduced, the charge propagation path between the first sub-pixels 101 and the second sub-pixels 102 can be reduced, and the leakage current between the first sub-pixels 101 and the second sub-pixels 102 can be improved, thereby improving the phenomenon of "light stealing" of the sub-pixels and improving the display quality of the display panel 100.

In the embodiment of the present application, the area of the first virtual quadrilateral D1 may be greater than or equal to the area of the second virtual quadrilateral D2, or the area of the first virtual quadrilateral D1 may be less than the area of the second virtual quadrilateral D2.

In the embodiment of the present application, the third sub-pixels 103 in the third column $n_3$ is at least partially overlapped with the one of the first sub-pixels 101 in the fourth column $n_4$ and the one of adjacent two of the second sub-pixels 102 in the second column $n_2$ along the second direction.

Figure 6:
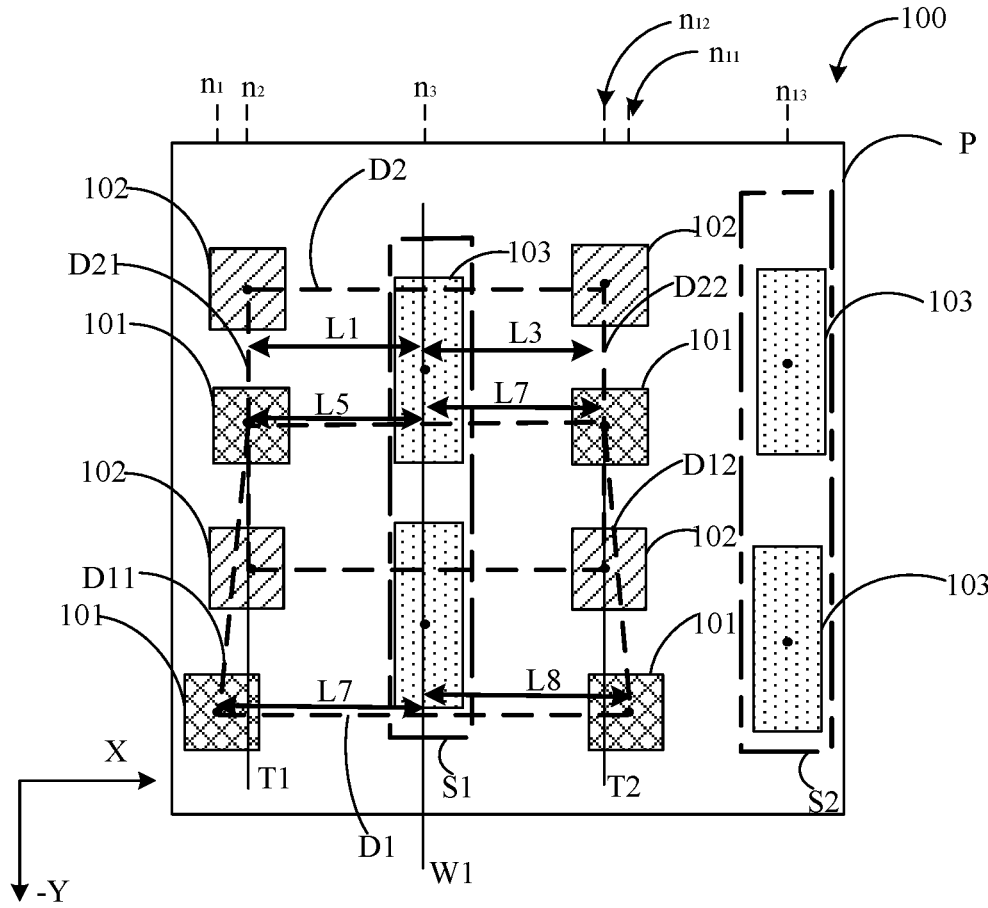
FIG. 6 is a fifth schematic plan view of the display panel provided by the embodiment of the present application.

Please refer to FIG. 6, FIG. 6 is a fifth schematic plan view of the display panel provided by the embodiment of the present application. A difference between the display panel 100 provided in the embodiment of the present application and the display panel 100 provided in FIG. 4 is that center points of a part of the plurality of the first sub-pixels 101 are arranged in the second column $n_2$, center points of a part of the plurality of second sub-pixels 102 and center points of a part of the plurality of first sub-pixels 101 are arranged in the twelfth column $n_{12}$, wherein one of the first sub-pixels 101 located in the second column $n_2$ is arranged between the adjacent two of the second sub-pixels 102, one of the first sub-pixels 101 located in the twelfth column $n_{12}$ is arranged between the adjacent two of the second sub-pixels 102. The center point of the one of the first sub-pixels 101 in the first column $n_1$, the center point of the one of the first sub-pixels 102 in the second column $n_2$, the center point of the one of the first sub-pixels 101 in the eleventh column $n_{11}$, and the center point of the one of the first sub-pixels 101 in the twelfth column $n_{12}$ adjacent to the third sub-pixels 103 in the third column $n_3$ form the first virtual quadrilateral D1, and the first virtual quadrilateral D1 is an isosceles trapezoid.

It can be understood that in the embodiment of the present application, the extension line T1 of the first side D21 of the second virtual quadrilateral D2 intersects with the second side D11 of the first virtual quadrilateral D1. The first side D21 is parallel to the first virtual axis W1, and the extension line of the second side D11 of the first virtual quadrilateral D1 intersects the first virtual axis W1.

In the embodiment of the present application, the first distance L1 is defined between the first side D21 of the second virtual quadrilateral D2 and the first virtual axis W1. The fifth distance L5 and the sixth distance L6 are defined between the two end points of the second side D11 of the first virtual quadrilateral D1 and the first virtual axis W1. The fifth distance L5 is equal to the first distance L1 and the sixth distance L6 is greater than the first distance L1.

The extension line T2 of the third side D22 of the second virtual quadrilateral D2 located on the another side of the first pixel column S1 intersects with the fourth side D12 of the first virtual quadrilateral D1 located on the another side of the first pixel column S1. The third distance L3 is defined between the third side D22 of the second virtual quadrilateral D2 and the first virtual axis W1. The seventh distance L7 and the eighth distance L8 are defined between the two end points of the third side D22 of the first virtual quadrilateral D1 and the first virtual axis W1.

The seventh distance L7 is equal to the third distance L3 and the eighth distance L8 is greater than the third distance L3.

In some embodiments, the seventh distance L7 is equal to the fifth distance L5, and the sixth distance L6 is equal to the eighth distance L8.

That is, in the embodiment of the present application, the first sub-pixels 101 in the first column $n_1$ are shifted to the side away from the third sub-pixels 103 in the third column $n_3$, and the first sub-pixels 101 in the eleventh column $n_{11}$ are shifted to the side away from the third sub-pixels 103 in the third column $n_3$, so that the first sub-pixels 101 and the second sub-pixels 102 are staggered in the first direction, thereby improving the phenomenon of "light stealing" of the sub-pixel and improving the display quality of the display panel 100.

Figure 7:
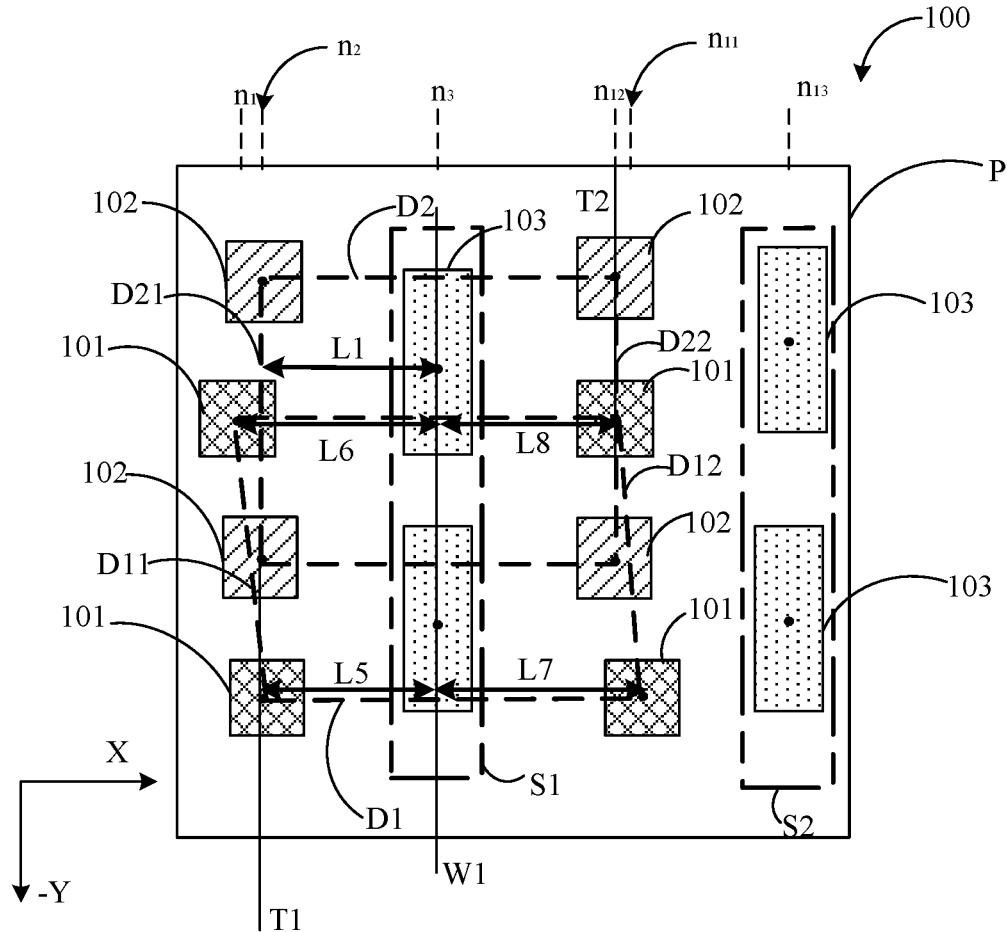
FIG. 7 is a sixth schematic plan view of the display panel provided by the embodiment of the present application.

Please refer to FIG. 7, FIG. 7 is a sixth schematic plan view of the display panel provided by the embodiment of the present application. A difference between the display panel 100 provided in the embodiment of the present application and the display panel 100 provided in FIG. 6 is that the first virtual quadrilateral D1 is a parallelogram and the second virtual quadrilateral D2 is a rectangle.

In the embodiment of the present application, the area of the first virtual quadrilateral D1 is greater than the area of the second virtual quadrilateral D2.

It can be understood that in the embodiment of the present application, the extension line T1 of the first side D21 of the second virtual quadrilateral D2 intersects with the second side D11 of the first virtual quadrilateral D1. The first side D21 is parallel to the first virtual axis W1, and the extension line of the second side D11 of the first virtual quadrilateral D1 intersects the first virtual axis W1.

In the embodiment of the present application, the first distance L1 is defined between the first side D21 of the second virtual quadrilateral D2 and the first virtual axis W1. The fifth distance L5 and the sixth distance L6 are defined between the two end points of the second side D11 of the first virtual quadrilateral D1 and the first virtual axis W1. The fifth distance L5 is equal to the first distance L1 and the sixth distance L6 is greater than the first distance L1.

The extension line T2 of the third side D22 of the second virtual quadrilateral D2 located on the another side of the first pixel column S1 intersects with the fourth side D12 of the first virtual quadrilateral D1 located on the another side of the first pixel column S1 intersects with the fourth side D12 of the first virtual quadrilateral D1 located on the another side of the first pixel column S1. The third distance L3 is defined between the third side D22 of the second virtual quadrilateral D2 and the first virtual axis W1. The seventh distance L7 and the eighth distance L8 are defined between the two end points of the third side D22 of the first virtual quadrilateral D1 and the first virtual axis W1.

The seventh distance L7 is greater than the third distance L3 and the eighth distance L8 is equal to the third distance L3.

In some embodiments, the eighth distance L8 is equal to the fifth distance L5, and the sixth distance L6 is equal to the seventh distance L7.

That is, in the embodiment of the present application, the first sub-pixels 101 in the first column $n_1$ are shifted to the side away from the third sub-pixels 103 in the third column $n_3$, and the first sub-pixels 101 in the eleventh column $n_{11}$ are shifted to the side away from the third sub-pixels 103 in the third column $n_3$, so that the center points of the first sub-pixels 101 and the center points of the second sub-pixels 102 are arranged in two columns in the first direction, further, it is possible to reduce the overlaps between the first sub-pixels 101 and the second sub-pixels 102 in the first direction, reduce the charge propagation path between the first sub-pixels 101 and the second sub-pixels 102, thereby improving the leakage current between the first sub-pixels 101 and the second sub-pixels 102, thereby improving the phenomenon of "light stealing" of the sub-pixels, and improving the display quality of the display panel 100.

Figure 8:
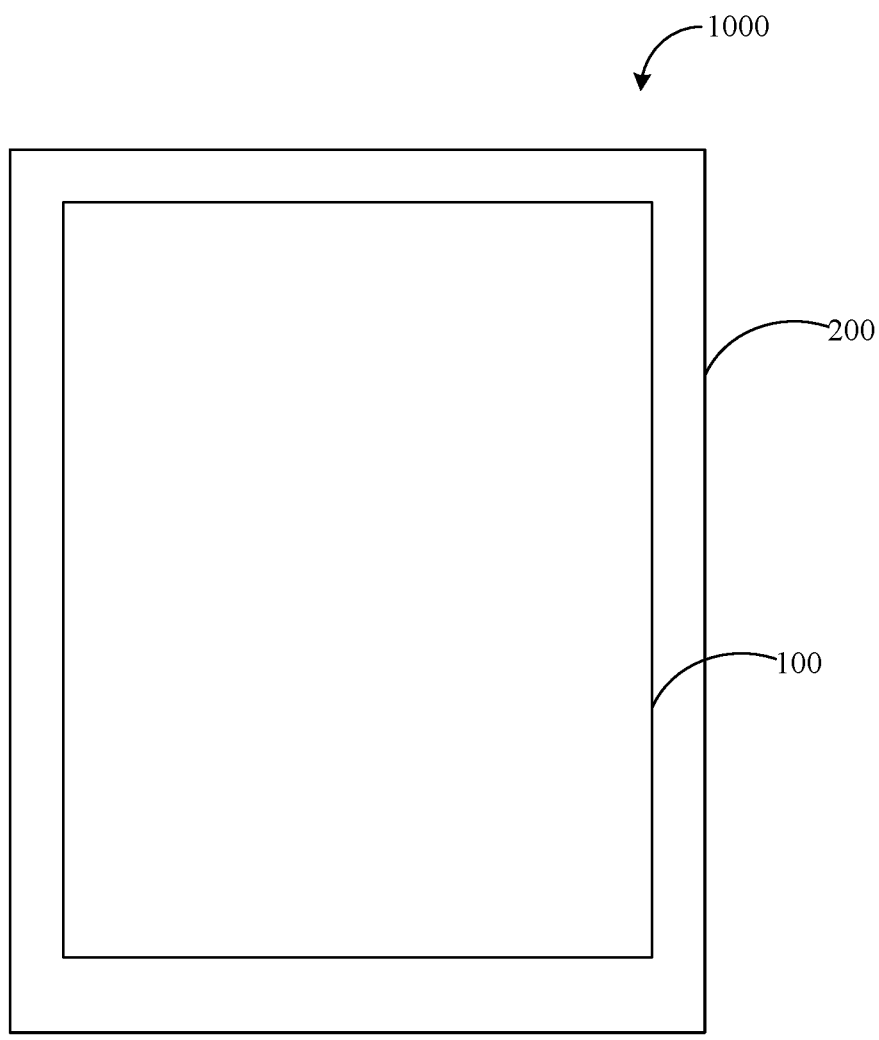
FIG. 8 is a schematic plan view of an intelligent terminal provided by the embodiment of the present application.

Please refer to FIG. 8, FIG. 8 is a schematic plan view of an intelligent terminal provided by the embodiment of the present application. The intelligent terminal 1000 provided in the embodiment of the present application includes a display panel 100 and a housing 200, wherein the display panel 100 is disposed in the housing 200.

It should be noted that the display panel 100 provided in the embodiment of the present application is the display panel 100 provided in any of the above embodiments.

The intelligent terminal 1000 can be at least one of a smartphone, a tablet personal computer, a mobile phone, a video phone, an e-book reader, a desktop PC, a laptop PC, a netbook computer, a workstation, a server, a personal digital assistant, a portable multimedia player, an MP3 player, a mobile medical machine, a camera, a game machine, a digital camera, an on-board navigator, an electronic billboard, an automatic teller machine, or a wearable device.

In summary, although the present application has been disclosed in preferred embodiments as above, the above-mentioned preferred embodiments are not intended to limit the present application. Those of ordinary skill in the art can make various modifications without departing from the spirit and scope of the present application. Therefore, the protection scope of the present application is subject to the scope defined by the claims.

What is claimed is:

1. A display panel, comprising a plurality of first sub-pixels configured to display a first color, a plurality of second sub-pixels configured to display a second color, and a plurality of third sub-pixels configured to display a third color, wherein the first color, the second color, and the third color are all different;

wherein center points of at least part of the plurality of first sub-pixels are arranged in a first column along a first direction, center points of at least part of the plurality of second sub-pixels are arranged in a second column along the first direction, and center points of at least part of the plurality of third sub-pixels are arranged in a third column along the first direction, the first column and the second column are both arranged on a side of the third column;

one of the first sub-pixels in the first column is arranged between adjacent two of the second sub-pixels in the second column along the first direction, and the one of the first sub-pixels in the first column and one of the adjacent two of the second sub-pixels in the second column are partially overlapped along the first direction; and one of the third sub-pixels in the third column and the one of the first sub-pixels in the first column are at least partially overlapped with one of the adjacent two of the second sub-pixels in the second column along a second direction;

wherein center points of another part of the plurality of first sub-pixels are arranged in an eleventh column along the first direction, center points of another part of the plurality of second sub-pixels are arranged in a twelfth column along the first direction, center points of another part of the plurality of the third sub-pixels are arranged in a thirteenth column along the first direction, and center points of a further part of the plurality of first sub-pixels are arranged in a fourteenth column along the first direction, wherein the eleventh column, the twelfth column, and the fourteenth column are all arranged between the thirteenth column and the third column, the eleventh column and the fourteenth column are arranged on both sides of the twelfth column; the eleventh column, the twelfth column, the thirteenth column and the fourteenth column are all arranged on another side of the third column.

2. The display panel according to claim 1, wherein center points of a still further part of the plurality of first sub-pixels are arranged in a fourth column along the first direction, wherein the first column, the second column, and the fourth column are all arranged on a side of the third column, and the first column and the fourth column are arranged on two sides of the second column, respectively; and one of the first sub-pixels in the fourth column is located between other adjacent two of the second sub-pixels in the second column, and the one of the first sub-pixels in the fourth column and one of the other adjacent two of the second sub-pixels in the second column are partially overlapped along the first direction.

3. The display panel according to claim 2, wherein one of the third sub-pixels in the third column and the one of the first sub-pixels in the fourth column are at least partially overlapped with one of the other adjacent two of the second sub-pixels in the second column along the second direction.

4. The display panel according to claim 2, wherein a center point of the one of the first sub-pixels in the first column adjacent to the third sub-pixels in the third column, a center point of the one of the first sub-pixels in the fourth column adjacent to the third sub-pixels in the third column, a center point of the one of the first sub-pixels in the eleventh column adjacent to the third sub-pixels in the third column, and a center point of the one of the first sub-pixels in the fourteenth column adjacent to the third sub-pixels in the third column form an isosceles trapezoid or a parallelogram.

5. The display panel according to claim 1, wherein center points of adjacent two of the first sub-pixels in the first column, center points of adjacent two of the first sub-pixels in the eleventh column adjacent to the third sub-pixels in the third column form a first virtual quadrilateral;

center points of adjacent two of the second sub-pixels in the second column and center points of adjacent two of the second sub-pixels in the twelfth column adjacent to the third sub-pixels in the third column form a second virtual quadrilateral; and wherein the first virtual quadrilateral is an isosceles trapezoid and the second virtual quadrilateral is rectangular.

6. The display panel according to claim 5, wherein the first column is arranged on a side of the second column away from the third column, the eleventh column is arranged between the twelfth column and the third column;

or, the first column is arranged between the second column and the third column, the eleventh column is arranged on the side of the twelfth column away from the third column.

7. The display panel according to claim 5, wherein the second column is arranged on a side of the first column away from the third column, and the twelfth column is arranged on a side of the eleventh column away from the thirteenth column.

8. The display panel according to claim 5, wherein the second column and the twelfth column are arranged between the first column and the eleventh column.

9. The display panel according to claim 1, wherein center points of a part of the plurality of first sub-pixels are arranged in the second column along the first direction, center points of a part of the plurality of first sub-pixels are arranged in an eleventh column along the first direction, and a part of the plurality of the second sub-pixels are arranged in an eleventh column along the first direction, center points of a part of the plurality of second sub-pixels and center points of a part of the plurality of first sub-pixels are arranged in a twelfth column along the first direction, center points of a part of the plurality of third sub-pixels are arranged in a thirteenth column along the first direction, the eleventh column and the twelfth column are all arranged on a side of the thirteenth column, and the eleventh column, the twelfth column, and the thirteenth column are all arranged on another side of the third column; wherein, one of the first sub-pixels located in the second column arranged between adjacent two of the second sub-pixels, and one of the first sub-pixels in the twelfth column is arranged between two adjacent second sub-pixels;

wherein a center point of one of the first sub-pixels in the first column, a center point of one of the first sub-pixels in the second column, a center point of one of the first sub-pixels in the eleventh column, and a center point of one of the first sub-pixels in the twelfth column adjacent to the third sub-pixels in the third column form a trapezoid or a parallelogram;

center points of adjacent two of the second sub-pixels in the second column and center points of adjacent two of the second sub-pixels in the twelfth column adjacent to the third sub-pixels in the third column form a second virtual quadrilateral.

10. The display panel according to claim 1, wherein areas of the third sub-pixels are greater than areas of the first sub-pixels, and areas of the third sub-pixels are greater than areas of the second sub-pixels.

11. A display panel, comprising a plurality of repeating units arranged in an array, wherein each of the repeating units comprises four first sub-pixels configured to display a first color, four second sub-pixels configured to display a second color, and a plurality of third sub-pixels configured to display a third color, and the first color, the second color, and the third color are all different;

wherein a part of a plurality of the third sub-pixels among the plurality of third sub-pixels form a first pixel column along a first direction, and another part of the third sub-pixels form a second sub-pixel column along the first direction in the repeating units, the first pixel column is located at a side of the second pixel column; the first sub-pixels and the second sub-pixels are arranged on two sides of the first pixel column in the repeating units; and connection lines of center points of the four first sub-pixels on two sides of the first pixel column form a first virtual quadrilateral, and connection lines of center points of the four second sub-pixels on two sides of the first pixel column form a second virtual quadrilateral;

wherein a first side of the second virtual quadrilateral on a side of the first pixel column does not overlap with an extension line of a second side of the first virtual quadrilateral on the side of the first pixel column;

wherein a connection line connecting center points of a part of the plurality of third sub-pixels in the first pixel column is a first virtual axis;

wherein an extension line of a third side of the second virtual quadrilateral located on another side of the first pixel column is intersected with the fourth side of the first virtual quadrilateral located on the another side of the first pixel column;

a third distance is defined between the third side of the second virtual quadrilateral and the first virtual axis, a seventh distance and an eighth distance are defined between two end points of the fourth side of the first virtual quadrilateral and the first virtual axis, the fourth side is arranged between the first pixel column and the second pixel column;

one of the seventh distance and the eight distance is less than the third distance, and the other of the seventh distance and the eighth distance is greater than the third distance.

12. The display panel according to claim 11, wherein the first side of the second virtual quadrilateral is parallel to the second side of the first virtual quadrilateral.

13. The display panel according to claim 12, wherein the first side and the second side are parallel to the first virtual axis.

14. The display panel according to claim 13, wherein a first distance between the first side and the first virtual axis is less than or greater than a second distance between the second side and the first virtual axis.

15. The display panel according to claim 11, wherein an extension line of the first side of the second virtual quadrilateral intersects the second side of the first virtual quadrilateral.

16. The display panel according to claim 15, wherein the first side is parallel to the first virtual axis, and an extension line of the second side of the first virtual quadrilateral intersects the first virtual axis.

17. The display panel according to claim 16, wherein a first distance is defined between the first side of the second virtual quadrilateral and the first virtual axis;

a fifth distance and a sixth distance are defined between two end points of the second side of the first virtual quadrilateral and the first virtual axis; and the fifth distance is less than or equal to the first distance, and the sixth distance is greater than or equal to the first distance.

18. The display panel according to claim 11, wherein areas of the third sub-pixels are larger than areas of the first sub-pixels, and areas of the third sub-pixels are larger than areas of the second sub-pixels.

\* \* \* \* \*